ial Patent [19] [11] Patent Number: 4,496,646
Ito [45] Date of Patent: Jan. 29, 1985

[54] PHOTOSENSITIVE IMAGING MATERIAL
[75] Inventor: Kengo Ito, Tokyo, Japan
[73] Assignee: Sony Corporation, Tokyo, Japan
[21] Appl. No.: 557,167
[22] PCT Filed: Apr. 7, 1983
[86] PCT No.: PCT/JP83/00107
   § 371 Date: Nov. 29, 1983
   § 102(e) Date: Nov. 29, 1983
[87] PCT Pub. No.: WO83/03687
   PCT Pub. Date: Oct. 27, 1983
[30] Foreign Application Priority Data
   Apr. 7, 1982 [JP] Japan .................................. 57-57654
   Sep. 24, 1982 [JP] Japan ................................ 57-167125
[51] Int. Cl.$^3$ .......................... G03C 1/68; G03C 5/00;
                                      G03C 5/24; G08F 2/50
[52] U.S. Cl. ..................................... 430/271; 430/273;
      430/281; 430/288; 430/905; 430/538; 430/919;
      430/920; 204/159.18; 204/159.23
[58] Field of Search ............... 430/920, 281, 271, 273,
      430/919, 905, 538, 288; 204/159.18, 159.23

[56]          References Cited
         U.S. PATENT DOCUMENTS
   3,649,495   3/1972  Rust .................................... 430/920

Primary Examiner—Jack P. Brammer
Attorney, Agent, or Firm—Hill, Van Santen, Steadman & Simpson

[57]                 ABSTRACT
A photosensitive imaging material utilizing changes in adhesive properties due to light, wherein an alloxazin derivative represented by the general formula:

[wherein R's may be the same or different from each other and each represents an alkyl group having 1 to 20 carbon atoms or a phenylalkyl group represented by the formula:

(wherein n is an integer of 1 or more)] is used as a photopolymerization initiator, thereby enhancing the photographic speed and photographic sensitivity of the photosensitive material.

Further, in order that the photosensitive material can possess image halftone reproducibility per se, the photosensitive material may be made into a composite material in which a photosensitive layer additionally containing a tertiary amine as a sensitizer is laminated on a hardened layer formed by hardening a photosensitive composition. The photosensitive imaging material of this invention thus constructed can be employed as a copying material for recording or reproducing projected images from a cathode ray tube or a fiber tube.

23 Claims, 14 Drawing Figures

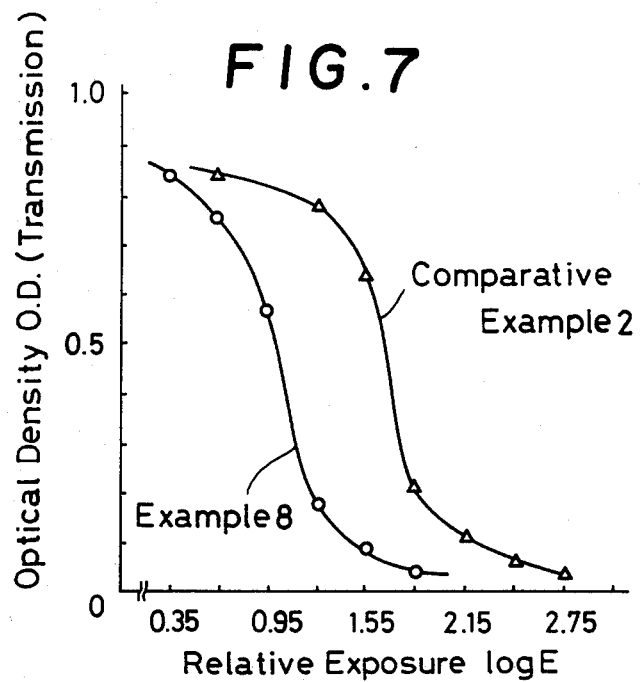
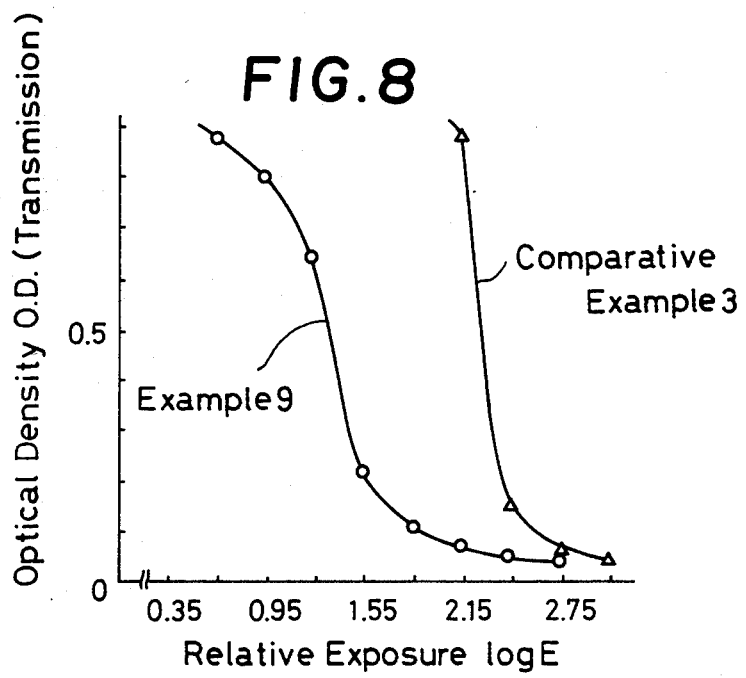

PHOTOSENSITIVE IMAGING MATERIAL

TECHNICAL FIELD

This invention relates to photosensitive imaging materials, and more particularly to photosensitive imaging materials having a high photographic speed (photographic sensitivity) and halftone reproducibility.

BACKGROUND ART

As one of image-copying techniques, there has been known a method of performing copying by using a photosensitive material which exhibits a change in adhesive properties upon subjected to light. This technique lies on an extension of the photoengraving technique, and copying has been conventionally performed by a sequence of steps of exposing imagewise the photosensitive material to actinic radiation through an original film such as a halftone positive recorded by dot separation according to silver salt photographic technique, etc., to cause a change in tackiness in the exposed areas, and dusting with a pigment. The photosensitive material used in this technique is constructed as a photosensitive film composed of a base film transparent to the actinic radiation and a photosensitive layer tacky at room temperature. The photosensitive layer of this photosensitive film is in turn composed of a uniform composition comprising a polymerization initiator (hereinafter refered to as the "photopolymerization initiator") for photosensitized polymerization, a polymerizable or crosslinkable monomeric compound and a binder comprising a thermoplastic polymer. This photosensitive film is characteristic of exhibiting a significant change in tackiness when exposed to actinic radiation such as ultraviolet rays or the like whose energy density is several $mJ/cm^2$–10 $mJ/cm^2$. This change in tackiness is due to that the photopolymerization initiator of the photosensitive layer is excited by the energy of the actinic radiation and a polymerization or crosslinking reaction of the monomer is brought about, thereby the photosensitive layer is hardened. And, for example, where imagewise exposure of the photosensitive film is performed through an original film such as a halftone positive by using a ultra-high pressure mercury lamp as actinic radiation (ultraviolet radiation) furnishing source on condition that the actinic radiation intensity at the exposed surface is 0.2 $mW/cm^2$, the image-copying is achieved by several ten seconds exposure.

As described above, in the image-copying technique employing a photosensitive material which exhibits a change in tackiness upon subjected to light, copying is conventionally performed indirectly by employing an original film recorded by dot separation. This is because since this photosensitive material has almost no halftone reproducibility per se, it is necessary to convert the light intensity information of the original film into monochromatic area. Therefore, where this photosensitive material is to be applied to a method of recording a light image directly from a photoimage generating device such as a cathode ray tube which emanates ultraviolet rays, a fiber tube or the like, it is necessary to subject the photoimages to electrical area-converting treatment. As a result, a great loss in the amount of the actinic radiation is caused due to, e.g., attenuation by an optical system employed for image formation. Also, since the light intensity is small in these light image generating devices, an exposure time of several $10^3$ hours is required for image recording. Therefore, in this case, it is difficult to obtain a practical photographic speed or resolving power.

DISCLOSURE OF THE INVENTION

An object of this invention is to provide a photosensitive imaging material in which the drawbacks of the conventionally known photosensitive films is improved and has an increased photographic speed, i.e., photographic sensitivity, thereby enabling the imaging in relatively short time. It is another object of this invention to provide a photosensitive imaging material having halftone reproducibility per se.

In the photosensitive imaging material according to this invention, by employing as a photopolymerization initiator, an alloxazine derivative of the general formula:

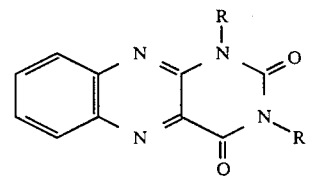

wherein R's may be the same or different from each other and each represents an alkyl group having 1 to 20 carbon atoms or a phenylalkyl group of the general formula:

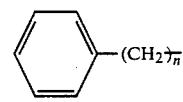

wherein n is an integer of 1 or more, the initiating reaction of photopolymerization or crosslinking of a polymerizable tackifying monomer is promoted, so that it is made possible to increase the photographic speed and photographic sensitivity. Further, in this invention, by making the photosensitive imaging material into a photosensitive composite material in which a photosensitive layer containing a binder, a polymerizable tackifying monomer, an alloxazine derivative and a tertiary amine is laminated on a hardened layer formed by hardening a composition containing a binder, a polymerizable tackifying monomer and an alloxazine derivative by irradiation with light, it is made possible to change the tackiness of the photosensitive layer depending on the exposure. Thus, the halftone reproducibility is imparted to the photosensitive material per se, thereby enabling a direct reproduce of photoimages from a photoimage generating source without area converting treatment.

BRIEF DESCRIPTION OF THE DRAWINGS

FIG. 6–FIG. 9 are graphs showing the photosensitive characteristics of the photosensitive films according to the Examples of this invention and the Comparative Examples, respectively.

BEST MODE OF CARRYING OUT THE INVENTION

Figure 1:
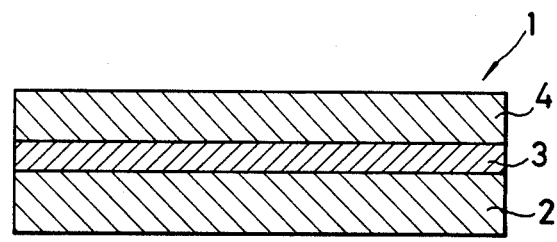
FIG. 1 is a cross-sectional view showing one example of the photosensitive film employing the photosensitive imaging material of this invention.

The photosensitive imaging material according to this invention has, as a basic composition, a polymerizable monomer for attaching a pigment or a coloring agent, a binder for making this polymerizable monomer into a film and an alloxazine derivative as a photopolymerization initiator for the polymerizable monomer.

The alloxazine derivative employed in this invention is a light absorbing species, which acts as a polymerization initiator owing to a function of withdrawing hydrogen from other components of the photosensitive material, and has excellent compatibility in spectral properties with light source. Further, since it is lipophilic, it has good compatibility with the hyrophobic compound used as the binder or the polymerizable monomer and is suitable for forming a uniform film. This alloxazine derivative is represented by the general formula:

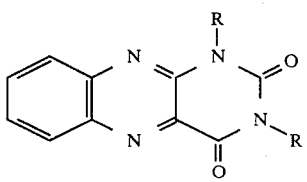

[wherein R's may be the same or different from each other and each represents an alkyl group having 1 to 20 carbon atoms or a phenylalkyl group of the general formula:

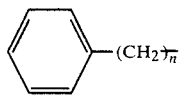

(wherein n is an integer of 1 or more)]. In the substituent R's of this alloxazine drivative, the number of the carbon atoms in the alkyl group is preferably in the range of from 2 to 16, more preferably in the range of from 4 to 12. Where the number of the carbon atoms in the above alkyl group is too large, the compatibility with the binder used becomes poor, whereas an alloxazine derivative having no alkyl group in the substituent R's is not suitable for to use because of low solubility in solvents. Further, since the solvent which can dissolve the alloxazine derivative varies depending on the chain length of the alkyl group in the substituent R's, the solvent may be appropriately selected according to the kind of the alloxazine derivative used.

The binder to be employed in this invention may be any as long as it is a polymer which has film-forming properties and is colorless and transparent when made into a film. Examples of this polymer may include cellulose derivatives such as cellulose acetate, cellulose acetate butyrate, etc., polyacrylic esters, polymethacrylic esters and the like. As the polymerizable monomer for imparting tackiness to the material of this invention is employed a compound which has one or more, preferably two or more, acrylic or methacrylic double bonds in the molecule and hardens by polymerization or crosslinking when irradiated with light. Examples of the polymerizable monomer may include alkyl esters or hydroxyalkyl esters of monofunctional (meth)acrylic acids, such as 2-ethylhexyl acrylate, 2-ethylhexyl methacrylate, 2-hydroxyethyl acrylate, 2-hydroxyethyl methacrylate, 2-hydroxypropyl acrylate, 2-hydroxypropyl methacrylate, etc., difunctional (meth)acrylic esters such as. diethylene glycol diacrylate, diethylene glycol dimethacrylate, 1,3-butanediol diacrylate, 1,3-butanediol dimethacrylate, 1,6-hexanediol diacrylate, 1,6-hexanediol dimethacylate, neopentyl glycol diacrylate, neopentyl glycol dimethyacrylate, etc., trifunctional (meth)acrylic esters such as trimethylolpropane triacrylate, trimethylolpropane trimethylacrylate, pentaerythritol triacrylate, pentaerythritol methacrylate, etc., polyfunctional (meth)acrylic esters such as dipentaerythritol hexaacrylate, dipentaerythritol hexamethacrylate, etc., and the like. Among these monomers, di- or higher-functional ones are preferred.

In this invention, as an auxiliary chemical species for promoting the above-described polymerization or crosslinking of the polymerizable monomer, it is effective to employ a tertiary amine by incorporating in the photosensitive material. This tertiary amine may be, e.g., an aromatic aliphatic tertiary amine or an aliphatic tertiary amine, which preferably has a structure containing withdrawable hydrogen in the skeletone thereof. Useful aromatic aliphatic tertiary amine may include, e.g., tribenzylamine, triphenylamine, etc. Further, useful aliphatic tertiary amine may include, e.g., trihydroxyalkylamines such as trimethanolamine, triethanolamine, etc.; trialkylamines preferably having 5 to 12 carbon atoms, e.g., tri-n-pentylamine, tri-n-dodecylamine, etc.; triacyloxyamines, which are esters of trihydroxyalkylamines and fatty acids having 2 or more carbon atoms, such as triacetoxymethylamine, triacetoxyethylamine, tripropioxymethylamine, tripropioxyethylamine, etc.; and the like.

In this invention, tackiness is imparted to the photosensitive layer by mixing the above polymer with the above polymerizable monomer. The mixing proportion is appropriately selected within the range of about 10:1 to 1:10 by weight by taking the viscosity, tack strength, etc., into consideration. The amount of the alloxazine derivative used is preferably in the range from about 0.01 to 15 parts by weight based on 100 parts by weight of the total amount of the above polymer and monomer. Where the amount of this alloxazine is too small, the effect as the photopolymerization initiator is unsatisfactory, and where it is too large, the film obtained is likely to take on color and not preferred. Furthermore, the amount of the tertiary amine used is preferably in a range from about 0.5 to 15 parts by weight based on 100 parts by weight of the total amount of the above polymer and monomer. Where the amount of the tertiary amine is too small, the effect cannot be expected, and too large amount of the tertiary amine is not preferred because of exceeding the solubility limit.

Further, in this invention, depending on the case, for example, where the photosensitive material is taking on color, it is preferable to incorporate in the photosensitive material a brightening agent which fluoresces in an emission band of about 400–480 nm and is excellent in compatibility with other components of the material. Useful brightening agents may include anthracene derivatives, e.g., 9,10-dichloroanthracene, etc.; stilbene derivatives; quinolone derivatives; coumarin derivatives, e.g., B 7-diethylamino-4-methylcoumarin, oxazole derivatives, etc.

The photosensitive imaging material according to this invention composed of the above-described composition may be, for example, as shown in FIG. 1, coated on a base film 2 transparent to actinic radiation to a predetermined thickness to form a film as a photosensitive layer 3. This photosensitive layer is covered with a cover film 4, thereby a photosensitive film 1 is fabricated.

The method of transferring images to the thus obtained photosensitive film is performed by changing the tackiness of the photosensitive layer by imagewise exposure to actinic radiation, and dusting with a pigment, etc., to visualize. Multiple coloring is achieved by repeating this operation.

Figure 2A:
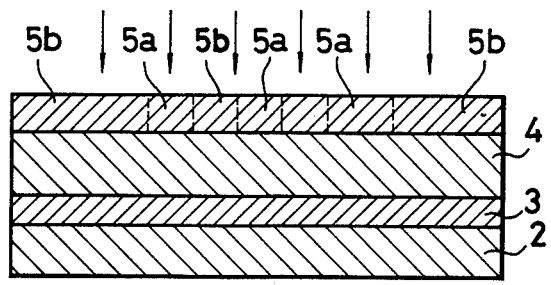
FIG. 2A–FIG. 2C are cross-sectional views showing the developing procedure of the photosensitive film of FIG. 1.
Figure 2B:
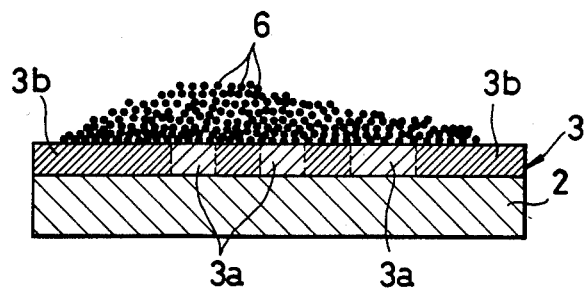
Figure 2C:
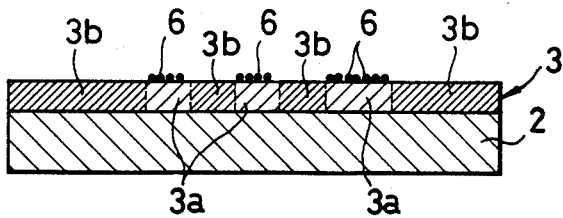

This transfer method is described in reference to FIGS. 2A–2C. In FIG. 2A, an original film having light non-transmissive parts 5a and light transmissive parts 5b in a predetermined pattern, i.e., a tablet is closely brought into contact with the base film 2 of the photosensitive film 1 having the composition shown in FIG. 1, and is irradiated with actinic radiation mainly composed of ultraviolet rays from above, thereby causing a change in tackiness between non-exposed areas 3a and exposed areas 3b corresponding respectively to the light non-transmissive parts and the light transmissive parts of the tablet. That is, in the exposed areas 3b, the polymerizable monomer of the photosensitive layer 3 proceeds with polymerizaton or crosslinking to harden, and as a result, the tackiness is lost, whereas on the non-exposed areas 3a, the tackiness is maintained because hardening does not take place. Thereafter, as shown in FIG. 2B, the cover film 4 is removed, and subsequently toner 6 is dusted on the photosensitive layer 3, so that as shown in FIG. 2C, the toner 6 adheres to the non-exposed parts 3a to form images. The production of the multicolored images is accomplished by further laminating photosensitive layers and repeating the steps of FIG. 2A and FIG. 2B successively.

Further, a photosensitive imaging material made into a composite material of a hardened layer or layers (hereinafter referred to the "sensitizing treating layer") made by using and hardening by irradiating with light the components for the above photosensitive material and a photosensitive layer or layers laminated thereon enables halftone reproduction of images. In this photosensitive composite material, the sensitizing treating layer is obtained by hardening a composition comprising a binder, a polymerizable tackifying monomer, and an alloxazine derivative as a photoporimerization initiator. The photosensitive layer contains a binder, a polymerizable tackifying monomer, an alloxazine derivative and a tertiary amine. For the alloxazine derivatives, binders and polymerizable monomers employed in these sensitilzing treating layer and photosensitive layer, any of the above-described compounds may be employed in the above-described compositional ratios, and these components may be either the same compound or different from each other between these two layers. Further, as the tertiary amine contained in the photosensitive layer, the above-described compounds may be employed, and this may also be employed by incorporating in the sensitizing treating layer.

Figure 3:
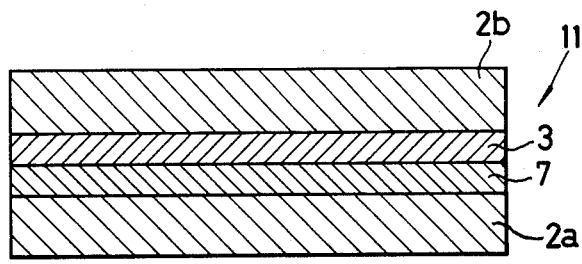
FIG. 3 is a cross-sectional view showing another example of the photosensitive film employing the photosensitive imaging material of this invention.

Such a composite photosensitive imaging material may be made into a photosensitive film 11 having a construction, e.g., as shown in FIG. 3. This photosensitive film 11 may be prepared as follows: First, the above components for the sensitizing treating layer are dissolved in a suitable solvent, thereby preparing a uniform composition. This is coated on a base film 2a transparent to actinic radiation, and the surface opposite to the base film 2a is covered with a similarly transparent cover sheet to form a sandwich-like film similar to FIG. 1. This sandwich film is subjected to exposure uniformly over the entire surface thereof, thereby hardening the coating of the composition to give a sensitizing treating layer 7. Thereafter, the above components for the photosensitive layer are dissolved in a solvent, then this is coated on a base film 2b and covered with a cover sheet, thereby giving a sandwich film in which the photosensitive layer 3 is placed between the base film and the cover sheet. The cover sheets of these two sandwich films are peeled off, respectively, and the photosensitive layer 3 is laminated on the sensitizing treating layer 7 by means of, e.g., a press roller, so that a photosensitive film 11 as shown in FIG. 3 can be obtained.

Transferring images to the photosensitive film thus obtained is performed by changing the tackiness of the photosensitive layer by imagewise exposure to actinic radiation as described below and subsequently dusting with a pigment or the like to visualize. The multiple coloring may be achieved by repeating this operation.

The principle of the imaging method utilizing the change in tackiness by light basically lies on the photopolymerization or crosslinking of the polymerizable monomer in the binder capable of forming a film, and where the reaction mechanism goes through a radical type process, it tends to undergo a reaction inhibitory effect due to oxygen molecules present in an atmosphere at the time of polymerization or crosslinking. The photosensitive material according to this invention is also liable to undergo such an inhibitory effect, but by employing the alloxazine derivative, which is a light absorbing species, as a photopolymerization initiator, and in particular, in the photosensitive layer, by employing it in combination with the tertiary amine, which is a sensitizing species enhancing the radical type photopolymerization initiating ability of the alloxazine derivative, it is possible to comparatively blunt the inhibitory effect at least owing to oxygen molecules dissolved in the composition. However, where a porous material such as paper is employed as a substrate to be an image receiver, the photosensitive composition is still not free from the inhibitory effect owing to oxygen which has permeated through the substrate.

In order to eliminate such an inhibitory effect and maintain the aforesaid sensitizing effect of the tertiary amine and the quality of images, at least one surface of the substrate is provided with an oxygen impermeable film and on this film is laminated the photosensitive composition comprising the aforesaid components.

The oxygen impermeable film is preferably transparent or white one which is smooth, rich in suppleness (flexibility) and excellent in adhesion to the sensitizing treating layer, and this may be comprising, e.g., a polyacrylate (e.g., polymethyl methacrylate, polyethyl ethacrylate), an acrylic copolymer (e.g., polyvinyl acetate acrylate, polyvinyl acetate methacrylate, polyvinylidene chloride methacrylate, polymethacrylic acid methacrylate), polyvinyl acetate, a polyvinyl acetate copolymer (e.g., vinyl acetate-vinyl chloride copolymer), a polyvinyl acetal (e.g., polyvinyl butyral), a cellulose ester (e.g., cellulose acetate, cellulose acetate butyrate), etc.

Figure 4A:
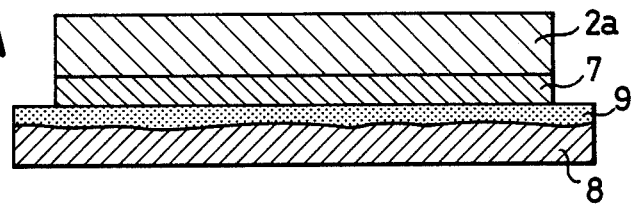
FIG. 4A and FIG. 4B are cross-sectional views showing the procedure of preparing a photosensitive film employing the photosensitive imaging material of this invention.
Figure 4B:
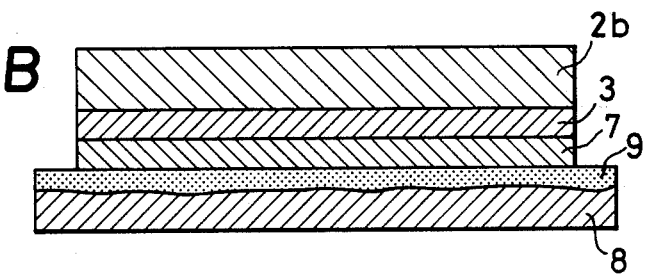

The photosensitive imaging material having the substrate bearing the above oxygen impermeable film may be made into a photosensitive film, for example, as shown in FIG. 4A–FIG. 4B. First, an oxygen impermeable film 9 is formed on one main surface of a substrate 8. Similarly as above, a sandwich film of a sensitizing treating layer is prepared. This sandwich film is peeled the cover sheet off and is laminated on the film 9 of the substrate 8 such that the base film 2a places on the top as shown in FIG. 4A. Thereafter, the sensitizing treating layer 7 is hardened by irradiating with actinic radiation mainly composed of ultraviolet rays from the base film 2a side. After the base film 2a is peeled off, the photosensitive layer 3 is laminated together with the base film 2b by using a press roller at room temperature as shown in FIG. 4B.

Figure 5A:
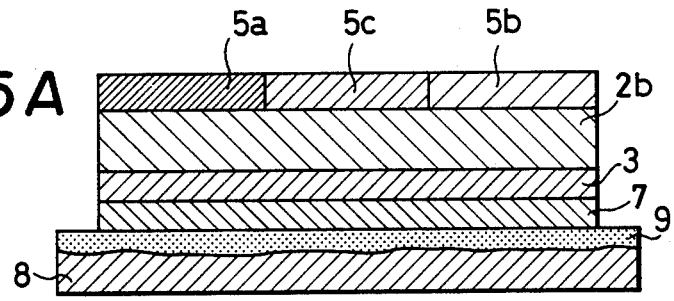
FIG. 5A and FIG. 5B are cross-sectional views showing the developing procedure of the photosensitive film of FIG. 4B.
Figure 5B:
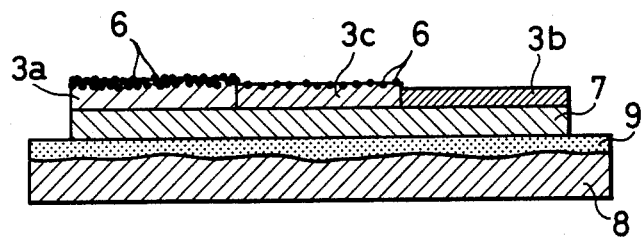

The method of transferring images to the thus prepared photosensitive film is described in reference to FIG. 5A and FIG. 5B. First, as shown in FIG. 5A, a tablet or a continuous tone positive original film for photography is brought into contact with the base film 2b as shown in FIG. 5A. This original film is that having a light non-transmissive part 5a and a light transmissive part 5b and also an intermediate transmissive part 5c between them. When this original film is irradiated with actinic radiation from above as shown in FIG. 5B, the tackiness changes among the non-exposed area 3a, exposed area 3b and intermediate exposed area 3c corresponding to the light non-transmissive part 5a, light transmissive part 5b and intermediate light transmissive part 5c of the original film, respectively. That is, in the exposed area 3b, the polymerizable monomer of the photosensitive layer 3 proceeds with photopolymerization or crosslinking and hardens, and as a result, the tackiness is lost, whereas in the non-exposed area 3a, since hardening does not take place, the tackiness is large, and further in the intermediate exposed area 3c, it is possible to change the tackiness according to the degree of exposure. As a result of changing the degree of polymerization in the photosensitive layer 3 depending on the degree of this exposure, corresponding unevenness, i.e., relief-like appearance is generated on the photosensitive layer 3. Thereafter, the original film and the base film 2b are removed, and subsequently a toner 6 is dusted on the photosensitive layer 3. As shown in FIG. 5B, since the toner 6 tends to adhere more to the less exposed area, it is possible to obtain images reproducing the continuous tone (half-tone) of the original film. The images has somewhat relief-like appearance. Further, a protective film may be formed, for example, by a treatment in which a photosensitive layer having the same composition is laminated on top of the toner-adhered photosensitive layer and irradiated with light to harden, whereby a glossy print of good quality may be obtained. In addition, multi-colored images may be obtained by repeating the laminating step shown in FIGS. 4A and 4B and the transferring step shown in FIG. 5A and FIG. 5B, alternately.

The alloxazine derivative having the above general formula to be employed in this invention may be synthesized, for example as follows: o-Phenylenediamine and alloxan are reacted and dehydrated at room temperature in an $N_2$ atmosphere to give alloxazine, and this alloxazine is reacted with an alkyl halide, e.g., an alkyl iodide in a solvent, e.g., N,N-dimethylformamide in the presence of potassium carbonate at room temperature, whereby an alloxazine derivative in which the 1- and 3-position have been substituted by alkyl may be obtained.

SYNTHESIS EXAMPLE 1

Synthesis of Alloxazine

There was charged 800 ml of water into an Erlenmeyer flask, then 3.5 g (30 mmoles) of o-phenylenediamine and 5.0 g (30 mmoles) of alloxan were added thereto, and the mixture was stirred at room temperature in a nitrogen atmosphere for about 5 hours. The obtained reaction mixture was cooled with ice for 3 hours, then the formed yellow precipitate was filtered off, and washed in ethanol and ether (50 ml, twice). This precipitate was recrystallized from an aqueous dimethylformamide solution to give pale yellow powdery crystals. Yield: 7.5 g (90%). M.p. 300° C. or higher. IR spectrum: Found values ($cm^{-1}$): 1730, 1705 (C=O stretching), 1572 (Broad peak) —C=N (amide II band). Literature values ($cm^{-1}$): 1727, 1700, 1574.

The literature values are those of 7,8-dimethylalloxazine (Lumichrome).

Elementary analysis value: $C_{10}N_4O_3H_8$; Found values: C: 51.65%, H: 3.51%, N: 24.04%; Calculated values: C: 51.72%, H: 3.47%, N: 24.23%.

SYNTHESIS EXAMPLE 2

Synthesis of 1,3-Didodecylalloxazine

To a round flask charged with 1.2 g (5.4 mmoles) of alloxazine obtained in Synthesis Example 1 and 6.0 g (20 mmoles) of dodecyl iodide were added about 160 ml of dimethylformamide and 4.0 g (29 mmoles) of potassium carbonate anhydride, and the mixture was stirred at room temperature for 42 hours.

The obtained reaction mixture was filtered to remove the insolubles ($K_2CO_3$), and the solvent of the filtrate was distilled off under a reduced pressure to give a brown oily substance as a residue. This residue was dissolved in chloroform, transferred to an extraction funnel, and washed in a 0.05N sodium hydroxide solution and water successively. After taking out the obtained chloroform phase, the solvent was concentrated under a reduced pressure, and a large amount of methanol was added, thereby separating a yellowish green precipitate. This precipitate was filtered out, washed in methanol, and thereafter recrystallized from a methanol-ethanol mixed solvent to give pale yellowish green powdery crystals. Yield: 2.5 g (85%). M.p.: 106°–108° C. (non-corrected). Thin layer chromatography: confirmed to be a single substance by silica gel—chloroform. Rf value: 0.6.

Elementary analysis value: $C_{34}H_{54}N_4O_2$; Found values: C: 74.04%, H: 9.89%, N: 10.12%; Calculated values: C: 74.14%, H: 9.88%, N: 10.17%.

PREPARATION EXAMPLE 3

A mixture of 2 g (0.009 mole) of the alloxazine obtained in Synthesis Example 1 and 10 g (0.05 mole) of pentyl iodide was stirred in the presence of 4 g of potassium carbonate anhydride in N,N-dimethylformamide at room temperature for 40 hours. After removing the insolubles from the obtained reaction mixture, the solvent was distilled off under a reduced pressure to a brown oily substance as a residue. This residue was dissolved in chloroform, and washed in a 0.05N sodium hydroxide aqueous solution and water successively. Then, after concentration and removing the solvent under a reduced pressure, a large amount of methanol was added, and the separated precipitate was recrystallized from a methanol-ethanol mixed solvent to give pale yellowish green powder crystals. Yield: 2.5 g. The crystals were easy to dissolve in most of organic solvents such as alcohol, chloroform, benzene, n-hexane, etc. Ultraviolet light absorption spectrum (in the dry coating in the photosensitive film): λmax 382 nm. There were shoulder absorptions in the vicinity of 370 and 400 nm.

This invention is now described in more detail by the examples.

EXAMPLE 1

A solution having the following composition was prepared:

| Composition | Weight (g) |
| --- | --- |
| 1,3-dipentylalloxazine (produced by Synthesis Example 3) | 0.1 |
| Triethylene glycol dimethacrylate | 5.8 |
| Polyethyl methacrylate | 8.0 |
| Trichloroethylene | 100.0 |

This mixture was stirred by using a magnetic stirrer at room temperature about for an hour to make a solution. This solution was coated on a polyethylene terephthalate film base having a thickness of 0.03 mm so as to give a coating having a wet thickness of 0.3 mm. After drying this coating at 60° C., a polyethylene cover film having a thickness of 0.06 mm was laminated on this coating at room temperature to give a sandwich photosensitive film.

A tablet (manufactured by Eastman Kodak Co., density difference 0.3, 11 grades) was brought into contacted with the film closely on its cover film side and exposed to light from a ultrahigh pressure mercury lamp (registered trademark "Jet Light" manufactured by Oak Seisakusho, Model UL-1300 Ms; Output 1 KW) as a light source for 30 seconds at a ultraviolet intensity of 2.8 mW/cm$^2$ at the exposed surface.

After completion of exposure, the cover film was peeled off, and the exposed surface of the photosensitive layer was dusted with a black toner manufactured by E. I. Du Pont de Nemours and Company. The excess toner was removed by using a absorbing wadding, so that it was found that the toner had been adhered only to the area where the exposure had been insufficient while it had not been adhered at all to the area corresponding to Grade 1 of the tablet (transmittance 89.13%).

EXAMPLE 2

A solution having the following composition was prepared.

| Composition | Weight (g) |
| --- | --- |
| 1,3-dipentylalloxazine (prepared by Synthesis Example 3) | 0.1 |
| Triethanolamine | 0.3 |
| Triethylene glycol dimethacrylate | 6.0 |
| Polymethyl methacrylate | 8.0 |
| Trichloroethylene | 100.0 |

Using this mixture, a sandwich photosensitive film was prepared in the same manner as in Example 1. After this photosensitive film was exposed to light and developed in the same manner as in Example 1, the toner did not adhere to the area corresponding to Grades 1–6 of the tablet (transmittance 2.82%). Further, the photosensitivity of this photosensitive film was about $2^5=32$ times as high as that of the photosensitive film of Example 1. As a result, it was found that the photosensitivity increases in a remarkable extent by incorporating a tertiary amine capable of generating a free radical upon photochemical reaction with an alloxazine light exciting species in the light curing composition described in Example 1.

EXAMPLE 3

A solution having the following composition was prepared:

| Composition | Weight (g) |
| --- | --- |
| 1,3-dipentylalloaxazine (prepared by Synthesis Example 3) | 0.02 |
| Tribenzylamine | 2.0 |
| Triethylene glycol dimethacrylate | 6.0 |
| Polymethyl methacrylate | 8.0 |
| Trichloroethylene | 100.0 |

This mixture was treated in the same manner as in Example 1 to give a sandwich film. After peeling the cover film off, the coating on the base film was heat pressed onto a chrome coated paper sheet (white, designated by E. I. Du Pont de Nemours and Company) at 90° C. by using a heat press roller. Then, a tablet was closely brought into contact with the base film and exposed to light under the same conditions as in Example 1 for 30 seconds. Thereafter, the base film was peeled off, and developing treatment was given to the surface of the photosensitive layer remaining on the chrome coated paper sheet, so that it was found that the toner had not been adhered to the area corresponding to Grades 1–8 (Transmittance 0.71%). Therefore, the photosensitivity of this film was about $2^7=128$ times as high as that of Example 1. As a result, it was found that among the tertiary amines, in particular, tribenzylamine is effective in respect to the compatibility and sensitivity. Further, it was found that this film shows significant photosensitivity when imparted with 0.6 mJ/cm$^2$ in ultraviolet energy density.

EXAMPLE 4

A solution having the following composition was prepared:

| Composition | Weight (g) |
| --- | --- |
| 1,3-dipentylalloxazine (prepared by Synthesis Example 3) | 0.01 |
| Tribenzylamine | 2.0 |
| 9,10-dichloroanthracene | 0.1 |
| Triethylene glycol dimethacrylate | 6.0 |
| Polymethyl methacrylate | 8.0 |
| Trichloroethylene | 100.0 |

This mixture was treated similarly as in Example 1 to give a sandwich photosensitive film. Then, the photosensitive layer was hot pressed on a chrome coated paper sheet in the same manner as in Example 3. A color-separated halftone positive film was closely brought into contact with the above base film and then exposed to light from the same light source as employed in Example 1 at the ultraviolet intensity at the exposed surface of 2.8 mW/cm² for 0.5 second.

After development was effected similarly as in Example 3, a photosensitive layer was further laminated on this layer, and exposed to light from the base film side for 0.3 second. Then, the base film was peeled off to give a glossy print of good quality. Although the employed photosensitive layer containing the alloxazine derivative gives images coloring somewhat in pale yellowish green, it is possible to obtain images even better in quality by employing, as an brightening agent, an organic fluorescent substance emanating fluorescence in the blue light wavelength ragion in the photosensitive layer.

EXAMPLE 5

A solution having the following composition was prepared:

| Composition | Weight (g) |
| --- | --- |
| 1,3-dipentylalloxazine (prepared by Synthesis Example 3) | 0.02 |
| Tri-n-dodecylamine | 1.00 |
| Triethylene glycol dimethacrylate | 6.00 |
| Polymethyl methacrylate | 8.00 |
| Trichloroethylene | 100.0 |

This mixture was treated similarly as in the examples described above to form a film. After exposed to light at 2.8 mW/cm² for 30 seconds, the film was developed. As a result, the toner had not been adhered at all to the region corresponding to Grade 1 (T=89.13%) of the tablet. The photographic sensitivity of this film was several times high as compared with the case of 1,3-dipentylalloxazine alone.

EXAMPLE 6

A solution having the following composition was prepared:

| Composition | Weight (g) |
| --- | --- |
| 1,3-dibenzylalloxazine (prepared according to Synthesis Examples 1 and 2 or 2) | 0.025 |
| Tribenzylamine | 0.90 |
| 9,10-dichloroanthracene | 0.025 |
| Triethylene glycol dimethacrylate | 7.0 |
| Polymethyl methacrylate | 8.0 |
| Trichloroethylene | 100.0 |

This mixture was made into a film in the same manner as above, and its photosensitive layer was hot pressed to a chrome-coated paper sheet. A tablet was closely brought into contact with the base film of this film and exposed to light, so that the toner was not adhered to the region corresponding to Grades 1-4 (T=89.13-11.22%) of the tablet.

EXAMPLE 7 AND COMPARATIVE EXAMPLE 1

A solution of the following composition was prepared:

| Composition | Weight (g) |
| --- | --- |
| 1,3-dipentylalloxazine (prepared by Synthesis Example 3) | 0.02 |
| Triethanolamine | 0.5 |
| Pentaerythritol triacrylate | 3.0 |
| Cellulose acetate butyrate | 5.0 |
| Methyl ethyl ketone | 50.0 |

This mixture was stirred by using a magnetic stirrer at room temperature for about an hour and made into a solution. This solution was coated on a polyethylen terephthalate base film having a thickness of 0.03 mm so as to give a wet thickness of 0.3 mm. The coating was dried at 60° C., and a polypropylene cover film having a thickness of 0.06 mm was laminated on this coating to give a sandwich photosensitive film.

As Comparative Example 1, a solution having the above composition except for not containing triethanolamine was prepared.

On the cover film sides of these sandwich films were closely brought into contact with tablets (manufactured by Eastman Kodak Co., Density difference 0.3, 11 grades), and each was exposed to light from a light source of a ultra-high pressure mercury lamp for a certain time. After completion of exposure, the polyethylene terephthalate base film was peeled off from each sandwich film, so that each photosensitive layer remained in all the amount on the cover sheet.

Figure 6:
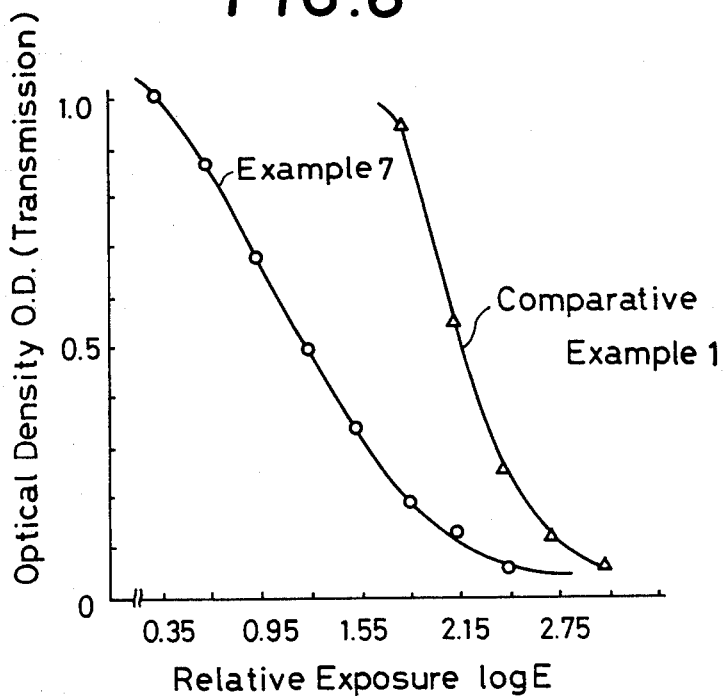

Thereafter, a black toner (manufactured by E. I. Du Pont de Nemours and Company) was dusted on the exposed surface of the photosensitive layer, and the excess toner was removed with absorbent wadding. As a result, the film of Example 7 showed a fluctuation in the amount of the remaining toner in a wider exposure range as compared with the film of Comparative Example 1, and moreover, the amount of the remaining toner was reduced almost in proportion to the logarithm of the exposure. That is, with the film of Example 7, the amount of the remaining toner was reduced continuously in accordance with the reduction of the transmittance of the tablet. Further, photosensitivity characteristic curves obtained by plotting the relationship between the optical density (transmission density) of each film and the logarithm of the exposure are shown in FIG. 6. From the above results, it may well be said that the use of the film of Example 7 will be sufficient for reproducing or copying a continuous tone positive film original for ordinary photography having a density difference of 2.0 (transmittance 1-100%).

EXAMPLE 8 AND COMPARATIVE EXAMPLE 2

A solution having the following composition was prepared:

| Composition | Weight (g) |
| --- | --- |
| 1,3-dipentylalloxazine (prepared by Synthesis Example 3) | 0.02 |
| Tribenzylamine | 2.0 |
| Triethylene glycol dimethacrylate | 6.0 |
| Polymethyl methacrylate | 8.0 |
| Trichloroethylene | 100.0 |

Using this mixture and similarly as in Example 7, a photosensitive film was prepared.

Also, as Comparative Example 2, using a solution having the above composition except that the content of tribenzylamine was 0.3 g, a photosensitive film was prepared similarly.

Next, these films were exposed to light, and each of the polyethylene terephthalate base films was peeled off, so that each photosensitive layer remained in all the amount on the cover sheet.

Then, each of the exposed surfaces of the photosensitive layers was subjected to development similarly as in Example 7. The photosensitivity characteristic curves of these films are shown in FIG. 7.

From FIG. 7, it was found that the photosensitive film of Comparative Example 2 containing the tribenzylamine is only a small amount was remarkably inferior in the photosensitive characteristics to Example 8 containing the tribenzylamine in a larger amount.

EXAMPLE 9 AND COMPARATIVE EXAMPLE 3

Using the solution having the following composition by weight and by similar procedures to those in Example 7, a sandwich photosensitive film was prepared. The wet coating of this film had a thickness of 0.15 mm.

| Compositions | Weight (g) |
| --- | --- |
| 1,3-dibenzylalloxazine (prepared according to Synthesis Examples 1 and 2 or 2) | 0.015 |
| 9,10-dichloroanthracene | 0.025 |
| Triethylene glycol dimethacrylate | 7.0 |
| Polymethacrylate | 8.0 |
| Trichloroethylene | 150.0 |

The obtained sandwich film was subjected to uniform exposure to light over an entire surface on the cover sheet side from a light source of a mercury lamp and excess exposure was effected to harden it, thereby preparing a sensitizing treating layer.

Then, the cover sheet of this sandwich film was peeled off, and on the exposed surface of the sensitizing treating layer was laminated a photosensitive layer having the same composition as the sensitizing treating layer by using a press roller. In such a way, a photosensitive film having the constitution as shown in FIG. 3 was obtained.

As a layer for imaging, the upper photosensitive layer of this photosensitive film was exposed to light through a tablet, and after the uppermost base film was peeled off, developing was performed. The photosensitivity characteristic curve of this film is shown in FIG. 8.

As Comparative Example 3, a photosensitive film in which a photosensitizing treating layer was not formed was prepared, and exposure and developing were performed for the film. The photosensitivity characteristic curve of this film is shown in FIG. 8.

EXAMPLE 10

Using a solution having the following composition by weight and by similar procedures to those in Example 7, a sandwich film was prepared, and further, similarly as in Example 9, a photosensitive film was prepared. With this photosensitive film, a sensitizing effect of $2^3$–$2^4$ times was observed, and the $\gamma$ value (the gradient of the photosensitivity characteristic curve) was reduced to $\frac{1}{2}$ or less.

| Composition | Weight (g) |
| --- | --- |
| 1,3-dibenzylalloxazine (prepared according to Synthesis Examples 1 and 2 or 2) | 0.015 |
| 9,10-dichloroanthracene | 0.025 |
| Tribenzylamine | 0.9 |
| Triethylene glycol dimethacrylate | 7.0 |
| Polymethyl methacrylate | 8.0 |
| Trichloroethylene | 150.0 |

EXAMPLE 11

A resin solution having the following composition was coated on the even surface of a mirror coated paper sheet by using an applicator for paint coating (wet coating thickness of 0.15 mm), and dried at 50° C. for 30 minutes, thereby preparing a surface treated paper sheet as an image receiver.

| Composition | Weight (g) |
| --- | --- |
| Polymethyl methacrylate | 10 |
| Triethylene glycol diacetate | 4 |
| Trichloroethylene | 150 |

Then, using the solution of the composition shown in Example 10, a sandwich film was prepared. The cover film of this film was peeled off, and a sensitizing treating layer was laminated on the resin-coated surface of the above-described image receiver with its base film placing on top as shown in FIG. 4A by means of a press roller at room temperature. Then, exposure was performed for 10 seconds on the base film side by using a ultra-high pressure mercury lamp as a light source under a condition that the ultraviolet intensity on the exposed surface was 2.4 mW/cm$^2$, and the base film was peeled off. Further, as shown in FIG. 4B, on the exposed surface of the sensitizing treating layer was laminated a photosensitive layer having the same composition as the sensitizing treating layer by means of a press roller. A tablet or a continuous tone positive original film for photography was closely brought into contact with the uppermost base film, and exposed at the same ultraviolet intensity as above for 4 seconds.

Figure 9:
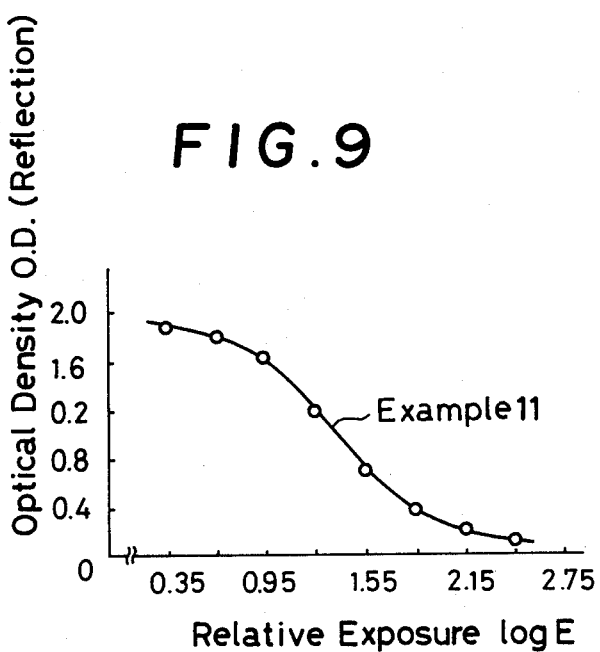

Then, after the base film was peeled off, the exposed surface of the photosensitive layer was subjected to development similarly as in Example 7 as shown in FIG. 5A and FIG. 5B. On this layer was further laminated a photosensitive layer having the same composition as above, and this layer was exposed to light on the base film side for 10 seconds to form a protective layer. Thereafter, the base film was peeled off to give a glossy monochromatic print of good quality having somewhat relief-like appearance. The photosensitivity characteristic curve of the obtained print is shown in FIG. 9.

EXAMPLE 12

On the even side surface of an art paper sheet was formed resin coating of the same composition as in Example 10, and this surface-treated paper was used as an image receiver.

Next, using a sandwich photosensitive film having the same composition as in Example 10 and by the procedures shown in FIG. 4A to FIG. 5B, the lamination, exposure and development of the photosensitive layers and the sensitizing treating layers were repeated, using color-separated continuous tone positive original films for photography. The form (trichromatic) and constitution of this print are shown in FIG. 10 and Table 1.

TABLE 1

Figure 10:
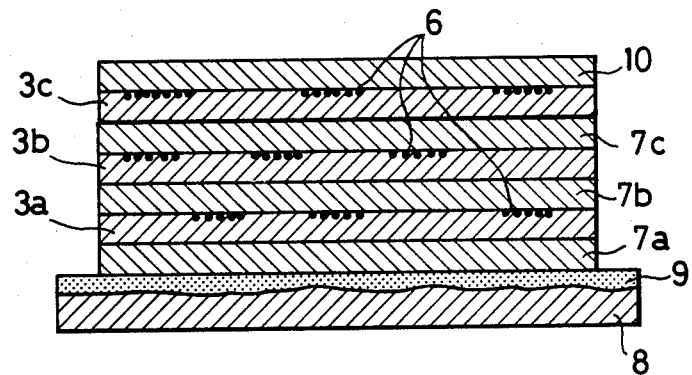
FIG. 10 is a cross-sectional view showing a multicolored print prepared by employing the photosensitive imaging material of this invention.

| Positive Original | Toner for Development | Exposure Time | Layer | Legend in FIG. 10 |
|---|---|---|---|---|
| — | — | 10 sec. | Sensitizing Treating Layer | 7a |
| Blue (B) | Yellow (Y) | 4 sec. | Photosensitive Layer | 3a |
| — | — | 10 sec. | Sensitizing Treating Layer | 7b |
| Green (G) | Magenta (M) | 4 sec. | Photosensitive Layer | 3b |
| — | — | 10 sec. | Sensitizing Layer | 7c |
| Red (R) | cyan (C) | 4 sec. | Photosensitive Layer | 3c |
| — | — | 10 sec. | Protective Layer | 10 |

As the toners, standard color pigments designated by E. I. Du Pont de Nemours and Company were pulverized and used. If the black density of the image is insufficient, it is enough to further add a step of forming a black plate.

Further, a protective layer was formed similarly as in Example 10, thereby a glossy multi-colored print of good quality having somewhat relief-like appearance was obtained.

EXAMPLE 13

Where the tackiness of the photosensitive layer at room temperature is relatively high, that is, where the content of the polymerizable monomer is relatively large, it is sufficient that only the lowest layer is the sensitizing treating layer, and by repeating lamination and imagewise exposure of each photosensitive layer alone, multiple coloring is possible.

A resinous film was formed on the even surface of a vinyl coated paper sheet for printing similarly as in Example 10, and this was used as an image receiver. Thereafter using a solution having the following composition and by the same procedures as in Example 7 (except that the wet coating thickness was 0.15 mm), a sandwich film for a sensitizing treating layer was obtained, and this was laminated on the above image receiver as shown in FIG. 4B.

| Composition | Weight (g) |
|---|---|
| 1,3-dihexadecylalloxazine (prepared according to Synthesis Example 2) | 0.01 |
| 9,10-dichloroanthracene | 0.03 |
| Tribenzylamine | 2.10 |
| Triethylene glycol dimethacrylate | 14.0 |
| Polymethyl methacrylate | 8.0 |
| Trichloroethylene | 150.0 |

By repeating the procedure shown in FIG. 4B, a photosensitive layer was laminated on the sensitizing treating layer. Further, a protective layer was formed similarly as in Example 10, thereby a glossy multi-colored print of good quality and rich in relief-like appearance was obtained. The constitution of this multi-colored print is shown in Table 2.

TABLE 2

| Positive Original | Toner for Development | Exposure Time | Layer |
|---|---|---|---|
| — | — | 20 sec. | Sensitizing Treating Layer |
| Blue (B) | Yellow (Y) | 15 sec. | Photosensitive Layer |
| Green (G) | magenta (M) | 15 sec. | Photosensitive Layer |
| Red (R) | cyan (C) | 15 sec. | Phostosensitive Layer |
| — | — | 20 sec. | Protective Layer |

INDUSTRIAL APPLICABILITY

By employing the imaging materials of this invention, it has now been made possible to obtain a practical photographic speed or resolving power, and further, to perform halftone (continuous tone) reproduction comparable to silver salt photography. Thus, similarly as with silver salt type photographic materials, it has now been made possible to record or reproduce a light image on a projected image of an actinic radiation (ultraviolet light) generating source such as a cathode ray tube, a fiber tube, a Braun tube, etc., directly on paper without halftone monochromatic area converting operation.

I claim:

1. A photosensitive imaging material which comprises a photosensitive composition containing an alloxazine derivative reprensated by the general formula:

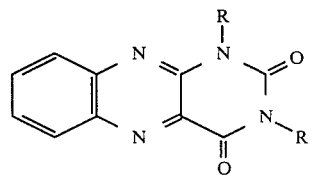

[wherein R's may be the same or different from each other and each represents an alkyl group having 1 to 20 carbon atoms or a phenylalkyl group of the general formula:

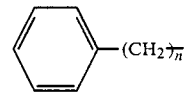

(wherein n represents an integer of 1 or more)] as a photopolymerization initiator, a binder and a polymerizable tackifying monomer.

2. A photosensitive imaging material according to claim 1 wherein the photosensitive composition further contains a tertiary amine.

3. A photosensitive imaging material which comprises:

(a) a hardened layer formed by hardening a composition containing an alloxazine derivative represented by the general formula:

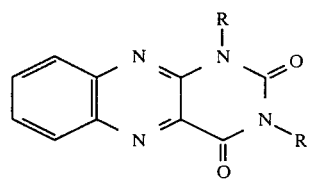

(I)

[wherein R's may be the same or different from each other and each represents an alkyl group having 1 to 20 carbon atoms or a phenylalkyl group of the general formula:

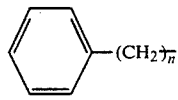

(wherein n represents an integer of 1 or more)] as a photopolymerization initiator, a binder and a polymerizable tackifying monomer, and (b) a photosensitive layer containing an alloxazine derivative represented the above general formula (I), a binder, a polymerizable tackifying monomer and a tertiary amine and being laminated on the hardened layer.

4. A photosensitive imaging material according to claim 1 or 3 wherein the photosensitive composition further contains a brightening agent.

5. A photosensitive imaging material according to claim 1 or 3 further comprising a substrate bearing an oxygen impermeable film on at least one surface thereof, and in which either the photosensitive composition, or the hardened layer and the photosensitive layer are laminated on this film.

6. A photosensitive imaging material according to claim 3 wherein the hardened layer further contains a tertiary amine.

7. A photosensitive imaging material according to claim 1 or 3 wherein the alloxazine derivative is obtainable by reacting alloxazine with an alkyl halide in the presence of potassium carbonate.

8. A photosensitive imaging material according to claim 1 or 3 wherein the alloxazine derivative is 1,3-dipentylalloxazine.

9. A photosensitive imaging material according to claim 1 or 3 wherein the alloxazine derivative is 1,3-didodecyl-alloxazine.

10. A photosensitive imaging material according to claim 1 or 3 wherein the alloxazine derivative is 1,3-dibenzylalloxazine.

11. A photosensitive imaging material according to claim 1 or 3 wherein the alloxazine derivative is 1,3-dihexadecylalloxazine.

12. A photosensitive imaging material according to any one of claims 2, 3 and 6 wherein the tertiary amine is an aromatic tertiary amine such as tribenzylamine, triphenetylamine.

13. A photosensitive imaging material according to any one of claims 2, 3 and 6 wherein the tertiary amine is an aliphatic tertiary amine such as a trialkylamine, a trihydroxyalkylamine, a triacyloxyamine.

14. A photosensitive imaging material according to claim 1 or 3 wherein the mixing ratio of the binder to the polymerizable tackifying monomer is in the range of from 10:1 to 1:10 by weight.

15. A photosensitive imaging material according to claim 1 or 3 wherein the content of the alloxazine derivative is in the range of from 0.01 to 15 parts by weight based on 100 parts by weight of the total amount of the binder and the polymerizable tackifying monomer.

16. A photosensitive imaging material according to any one of claims 2, 3 and 6 wherein the content of the tertiary amine is 0.5 to 15 parts by weight based on 100 parts by weight of the total amount of the binder and the polymerizable tackifying monomer.

17. A photosensitive imaging material according to claim 1 or 3 wherein the binder is a polymer such as a cellulose derivative, a polyacrylic ester, a polymethacrylic ester.

18. A photosensitive imaging material according to claim 1 or 3 wherein the polymerizable tackifying monomer is a compound having an acrylic or methacrylic double bond such as an acrylic ester or a methacrylic ester.

19. A photosensitive imaging material according to claim 18 wherein the polymerizable tackifying monomer is a compound having two or more acrylic or methacrylic double bonds in the molecule.

20. A photosensitive imaging material according to claim 5 wherein the substrate is composed of a porous material such as paper.

21. A photosensitive imaging material according to claim 5 wherein the film is composed of a polyacrylate, an acrylic copolymer, polyvinyl acetate, a polyvinyl acetate copolymer, polyvinyl acetal or a cellulose ester.

22. A photosensitive composition utilizing the photosensitive imaging material according to any one of claims 1, 3 and 5 which has a pigment or a coloring agent adhered to non-exposed area of the photosensitive material which has been subjected to partial exposure to light.

23. A photosensitive composition according to claim 22 which has a plurality of layers having a pigment or a coloring agent adhered thereto.

* * * * *